United States Patent
Magome et al.

(10) Patent No.: US 6,583,853 B1
(45) Date of Patent: Jun. 24, 2003

(54) METHOD OF MEASURING EXPOSURE CONDITION IN PROJECTION EXPOSURE APPARATUS

(75) Inventors: Nobutaka Magome, Tokyo (JP); Osamu Furukawa, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/435,367

(22) Filed: Nov. 8, 1999

Related U.S. Application Data

(63) Continuation of application No. 08/863,061, filed on May 23, 1997, now abandoned.

(30) Foreign Application Priority Data

May 24, 1996 (JP) ............................................. 8-153505

(51) Int. Cl.[7] ........................ G03B 27/42; G03B 27/54; G03B 27/74; G03B 27/32
(52) U.S. Cl. ............................ 355/53; 355/68; 355/67; 355/77
(58) Field of Search .............................. 355/53, 67, 68, 355/69, 71, 77; 250/492.22

(56) References Cited

U.S. PATENT DOCUMENTS

| | | | |
|---|---|---|---|
| 4,465,368 A | 8/1984 | Matsuura et al. ............. | 355/53 |
| 4,746,958 A * | 5/1988 | Yamakawa ..................... | 355/53 |
| 4,908,656 A | 3/1990 | Suwa et al. .................... | 355/53 |
| 5,473,410 A | 12/1995 | Nishi ............................ | 355/53 |
| 5,526,093 A | 6/1996 | Takahashi ..................... | 355/53 |
| 5,608,575 A * | 3/1997 | Suzuki .......................... | 355/53 |
| 5,627,627 A | 5/1997 | Suzuki .......................... | 355/68 |
| 5,659,383 A | 8/1997 | Ozawa ......................... | 355/53 |
| 5,734,462 A | 3/1998 | Sakai ........................... | 355/53 |
| 6,271,909 B1 * | 8/2001 | Suzuki et al. ................. | 355/53 |

* cited by examiner

*Primary Examiner*—Russell Adams
*Assistant Examiner*—Peter B. Kim
(74) *Attorney, Agent, or Firm*—Morgan, Lewis & Bockius LLP

(57) ABSTRACT

A method of obtaining an optimum exposure condition of a step-and-scan exposure apparatus, the step-and-scan exposure apparatus synchronously moving a mask and a substrate relative to an illumination light to transfer a pattern of the mask onto a plurality of shot areas on the substrate, the method comprising the steps of determining an unevenness of an illuminance of the illumination light, adjusting the illumination light to change the illuminance within a predetermined range, inputting a plurality of first exposure conditions into the step-and-scan exposure apparatus, testing the plurality of first exposure condition in a step-and-repeat mode.

20 Claims, 8 Drawing Sheets

METHOD OF MEASURING EXPOSURE CONDITION IN PROJECTION EXPOSURE APPARATUS

This application is a continuation of application Ser. No. 08/863,061 filed May 23, 1997, now abandoned.

This application claims the benefit of Japanese Application No. 08-153505 filed May 24, 1996, which is hereby incorporated by reference.

BACKGROUND OF THE INVENTION

1. Field of the Invention

The present invention relates to an exposure apparatus and a method of measuring an exposure condition, and more particularly, to a projection exposure apparatus and a method of measuring an exposure condition in an exposure apparatus. Although the present invention is suitable for a wide scope of applications, it is particularly suitable for measuring an optimum exposure condition in the projection exposure apparatus for a short period of time.

2. Discussion of the Related Art

In an exposure apparatus used in manufacturing highly integrated devices such as semiconductor devices, the line density of a transferred pattern has been higher, while the wavelength of exposure light in the apparatus has been shorter. It is thus required to control exposure conditions, such as an exposure amount and a focal position, even more precisely. However, it is not easy to obtain an optimum exposure amount and an optimum focal position. The optimum exposure amount is generally defined by a type of light source, reticle (or mask) and photoresist, and material of wafer. If a mercury-vapor lamp or an excimer laser is used as a light source, the illuminance of exposure light applied to a mask diminishes as time passes. When a phase-shift reticle or half-tone reticle is used to improve the resolution, the amount of light reaching a wafer (for example, a photosensitive substrate) varies with the specific type of reticle. This results from the different permeability of each phase-shift reticle or half-tone reticle. An absorption ratio of exposure light also various depending upon the material or thickness of the underlayer of the photoresist applied to the wafer. Accordingly, the optimum exposure amount also depends on the absorption ratio. An antireflection resist applied on the wafer can change the optimum exposure amount. On the other hand, the optimum focal position is not readily standardized because it depends on the manufacturing processes of the mask and the photosensitive substrate.

To this end, pre-exposure is conventionally performed to obtain the optimum exposure amount and the optimum focal position. In other words, test exposure is performed prior to actual exposure. Test exposure is performed, for example, on each of a plurality of exposure areas on the wafer while changing the parameter values of the exposure conditions, such as the exposure amount and focal position. After the wafer subjected to the test exposure is developed, the exposure result is observed by naked eyes or a microscope to determine the optimum exposure condition. Since the image-forming position varies with the exposure location on the wafer due to distortion of the image plane, test exposure should be applied to every exposure area on the wafer.

Recently, a step-and-scan exposure method has been proposed to enlarge the exposure area (a shot area) on the wafer. In the step-and-scan exposure method, an illumination light having a slit-like profile is emitted to the a reticle and the reticle and the wafer are synchronously moved with respect to the illumination light to transfer a reticle pattern onto the exposure areas on the wafer. This type of exposure apparatus also requires test exposure for every shot area. Test exposure is performed, while changing the exposure parameters, to create a matrix-type shot map representing the exposure state of each area.

However, in the recent step-and-scan method, the number of parameters, such as an exposure amount and focal position, affecting the optimum exposure condition increases, and the conventional method can not collect sufficient exposure parameters in the number of exposure areas (or shot areas) formed on a photosensitive substrate is limited in certain areas. Moreover, it is difficult for the conventional method to expose a pattern under a number of different exposure conditions.

In a step-and-scan exposure apparatus, since the dimension of an exposure area on the wafer is large, the number of shots (shot area) in one wafer decreases. Accordingly, the number of exposure conditions decreases. Further, if a pattern is exposed twice at different focal positions, the number of parameters for the test exposure increases, so that more shot areas are needed on the wafer to determine optimum condition. Also, since the reticle and the wafer are simultaneously scanned and moved for the test exposure, the step-and-scan method takes more time to obtain the optimum exposure condition.

SUMMARY OF THE INVENTION

Accordingly, the present invention is directed to a method of measuring an exposure condition for an exposure apparatus that substantially obviate problems due to limitations and disadvantages of the related art.

An object of the present invention is to provide a method of measuring an exposure condition in the projection apparatus for a short period of time.

Additional features and advantages of the invention will be set forth on the description which follows and in part will be apparent from the description, or may be learned by practice of the invention. The objectives and other advantages of the invention will be realized and attained by the structure particularly pointed out in the written description and claims hereof as well as the appended drawings.

To achieve these and the advantages and in accordance with the purpose of the present invention, as embodied and broadly described, the exposure method of the invention is suitable to obtain an optimum exposure condition for a scanning-type projection exposure apparatus that forms an illumination area on a mask, and moves the mask and a photosensitive substrate synchronously relative to the illumination area to transfer the pattern of the mask onto the photosensitive substrate. In another aspect of the present invention, an exposure method includes the first step of moving the photosensitive substrate in the stepwise manner, while maintaining the mask at rest, to successively expose plurality of sub-areas using predetermined pattern images on the photosensitive substrate while changing an exposure condition, and the second step of measuring the exposure condition based on the state of the predetermined pattern images formed in the respective sub-areas.

Preferably, one or more sub-area, in which substantially satisfactory pattern images are formed, are selected among the plurality of sub-areas. Then, the mask and the photosensitive substrate are synchronously moved to successively expose a plurality of shot areas on the photosensitive substrate using predetermined pattern images, while changing the exposure condition in the vicinity of the level of the exposure condition obtained in the selected sub-areas. The dimension of the shot area is set larger than that of the sub-area The exposure condition include an exposure amount and a position in the direction parallel to the optical axis of the illumination light.

Prior to obtaining the optimum exposure condition according to the steps described above, the luminance may be measured at a plurality of points within the illumination area on the photosensitive substrate. Fluctuation in the luminance of the illumination area may be detected based on the measured luminance.

In another aspect of the present invention, a plurality of sub-areas on the photosensitive substrate are successively exposed using predetermined pattern images with the mask being at rest, while changing the exposure conditions. This arrangement can form more exposure sub-areas on the photosensitive substrate, as compared with the case in which the mask and the photosensitive substrate are synchronously moved during exposure. Accordingly, the number of parameters used for determining the exposure conditions can be increased. This means that test exposure can be performed under various levels of the exposure condition, and the optimum exposure condition can determined with fine resolution.

Among the plurality of sub-areas exposed as described above, one or more sub-areas having substantially satisfactory pattern images formed therein are selected. Then, the mask and the photosensitive substrate are synchronously moved to exposure each of a plurality of shot areas on the photosensitive substrate, while changing the exposure condition in the vicinity of the level of the exposure condition obtained from the selected sub-areas.

In a further aspect of the present invention, a method of obtaining an optimum exposure condition of a step-and-scan exposure apparatus, the step-and-scan exposure apparatus synchronously moving a mask and a substrate relative to an illumination light to transfer a pattern of the mask onto a plurality of shot areas on the substrate, the method comprising the steps of determining an unevenness of an illuminance of the illumination light, adjusting the illumination light to change the illuminance within a predetermined range, inputting a plurality of first exposure conditions into the step-and-scan exposure apparatus, testing the plurality of first exposure condition in a step-and-repeat mode.

BRIEF DESCRIPTION OF THE DRAWING

The accompanying drawings, which are included to provide a further understanding of the invention and are incorporated in and constitutes a part of this opacification, illustrate embodiments of the invention and, together with the description, serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
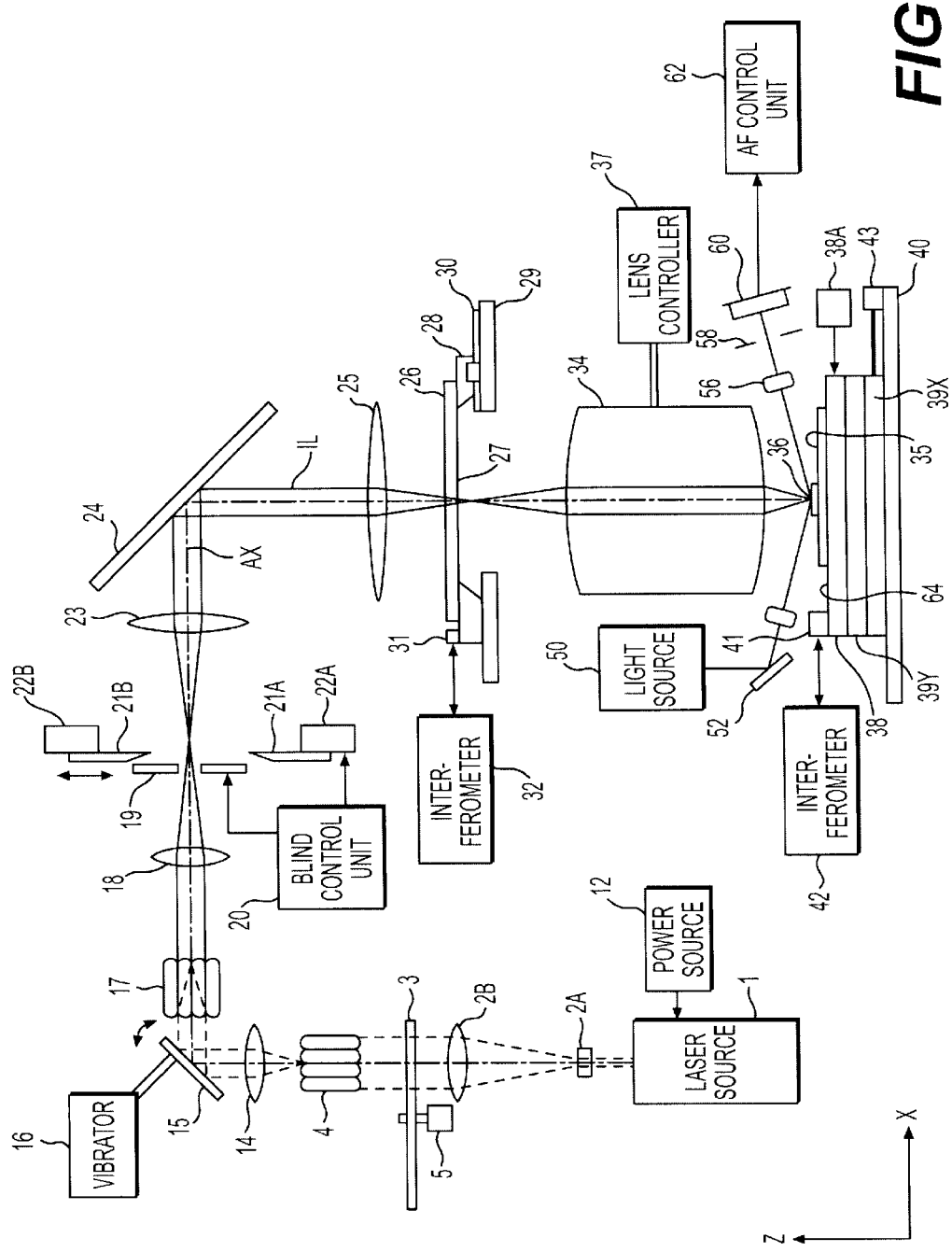
FIG. 1 is a schematic diagram of a scanning-type projection exposure apparatus according to a preferred embodiment of the present invention.

Referring to FIG. 1, a laser beam is emitted from a laser light source 1. For example, excimer laser including ArF excimer laser or KrF excimer laser, or pulsed laser including a YAG laser harmonic generator can be used as the laser light source 1. The profile of the laser beam is expanded by a beam expander having lenses 2A and 2B. The laser beam having an expanded profile passes through the light-quantity variable filter plate 3 and enters into a first fly-eye lens 4. The light-quantity variable filter plate 3 includes a plurality of light-quantity attenuation filters so that the light permeability varies in multiple grades along the circumference of a disc. The light-quantity variable filter plate 3 is rotated by a driving motor 5 to attenuate the quantity of the light passing through the filter plate 3 in multiple stages.

Figure 2:
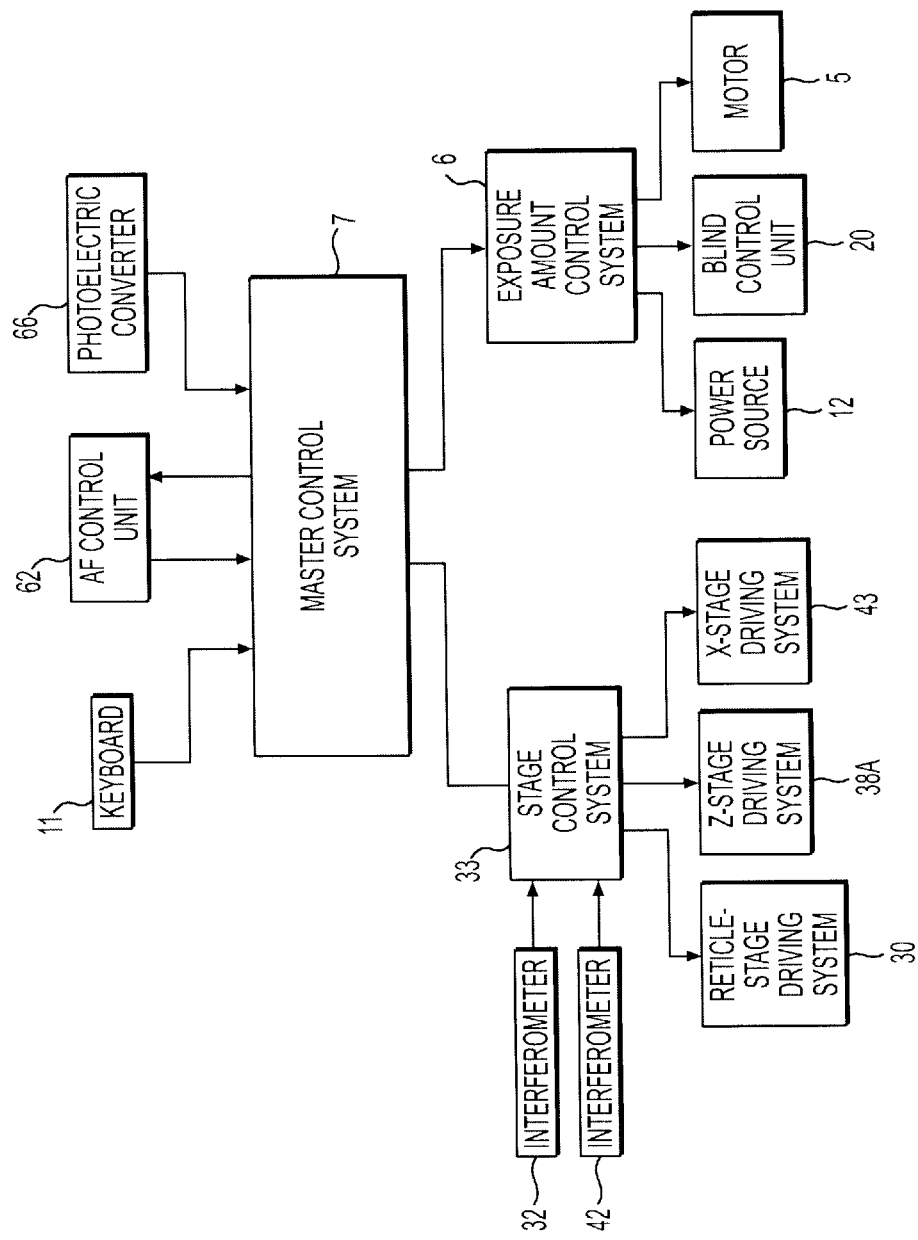
FIG. 2 is a block diagram of a control system controlling the exposure apparatus of FIG. 1.

The driving motor 5 is controlled by an exposure-amount control system 6 (shown in FIG. 2). The exposure-amount control system 6 continuously regulates the timing and quantity of the pulsed laser light source 1 to be emitted through a power source 12.

Referring to FIG. 2, the exposure-amount control system 6 controls an integrating exposure amount (exposure dose) on a wafer 35 (shown in FIG. 1) to obtain an appropriate value, and is regulated by a master control system 7 controlling the overall operations of the exposure apparatus of the present invention. A keyboard 11 is connected to the master control system 7 to input information, such as a type of reticle 26 to be exposed, a sensitivity of the photoresist on the wafer 35, and an arrangement of the shot areas on the wafer 35.

Referring to FIG. 1, the pulsed laser beam is emitted from a plurality of secondary light source formed on the exit plane of the first fly-eye lens 4, and passes through a collimator lens 14. The laser beam is then deflected by an oscillation mirror 15, and enters into the second fly-eye lens 17. The oscillation mirror 15 vibrates the laser beam in a predetermined direction through the vibrator 16 to reduce the uneven illuminance distribution on the wafer 35 caused by the interference fringes of the laser beam having strong coherency. The exit plane of the first fly-eye lens 4, the incident plane of the second fly-eye lens 17, and the pattern plane of the reticle 26 are positioned to be conjugate one another.

The pulsed laser beam (simply referred to as "illumination light") IL emitted from the second fly-eye lens 17, is collected by a first relay lens 18, and reaches a fixed blind (or fixed field stop) 19 defining a slit-like illumination area on a reticle 26. The fixed blind 19 is cleaned out of the optical path of the illumination light IL by the blind control unit 20 if necessary. The illumination light, which has passed through the aperture of the fixed blind 19, enters a movable blind composed of four movable blades (only tow movable blades 21A and 21B are shown in FIG. 1). The illumination light IL passes through the aperture of the movable blind 21A and 21B, second relay lens 23, optical-path changing mirror 24 and main condenser lens 25. Subsequently, the illumination light illuminates an illumination area 27 on the bottom surface (pattern plane) of the reticle 26 with uniform illumination distribution. The pattern image formed in the illumination area 27 of the reticle 26 is projected through a projection optical system 34 into an exposure area 36 on the wafer 35.

The movable blades 21A and 21B are supported by an opening/closing mechanism 22A and 22B, respectively to move back and forth along the direction perpendicular to the optical axis AX. The operation of the opening/closing mechanism 22A, 22B is controlled by the blind control unit 20.

The surface where the movable blind 21A and 21B are positioned is conjugal with the pattern plane of the reticle 26. The surface where the fixed blind 19 is positioned is slightly off the surface conjugated with the pattern plane of the reticle 26. In general, if only the fixed blind 19 is used, the pulsed illumination light IL passed through the outside of the light-blocking range surrounding the transfer pattern on the reticle 26 may expose the photoresist applied on the wafer 35 at the beginning and end of the scanning exposure. To avoid such situation, the movable blinds 21A and 21B is gradually opened with respect to the scanning direction, in synchronization with scanning of the reticle stage 28 and the wafer stage 39X, at the beginning of the scanning exposure. Conversely, the movable blind (21A, 21B) are gradually closed with respect to the scanning direction, in synchronization with scanning of the reticle stage 28 and the wafer stage 39X, at the end of the scanning exposure. This arrangement prevents the wafer 35 from being exposed with an unnecessary pattern. Moreover, because the movable blinds 21A and 21B functions as a shutter, the pulsed laser light source 1 emits the pulsed light only for the period of time when the blinds 21A and 21B start opening and then completely closes.

Next, the stage mechanism of the present invention will be described. In FIG. 1, the Z axis is taken along the direction parallel to the optical axis AX of the projection optical system, the X axis is taken along horizontal direction in the paper, which is within a paper plane of the perpendicular to the Z axis, and the Y axis is taken vertical to the paper plane. The reticle 26 is held on a reticle stage 28 through a reticle holder (not shown). The reticle stage 28 is mounted on a reticle base 29 and moves along the X direction (scanning direction) by a reticle stage driving system 30. A mobile mirror 31 is fixed at one end of the reticle stage 28 to reflect the laser beam emitted from a laser interferometer 32 positioned externally. The interferometer 32 constantly measures the X coordinate of the reticle stage 28 based on the reflected light from the mobile mirror 31. The X coordinate of the reticle stage 28, which is measured by the laser interferometer 32, is supplied to the stage control system 33 (shown in FIG. 2). The stage control system 33 controls the operation of the reticle stage driving system 30. A fine motion stage (not shown) is provided between the reticle stage 28 and the reticle 26 to move the reticle 26 in the X, Y, and rotational (θ) directions.

The wafer 35 is mounted on a wafer base 40 through a Z-leveling stage 38, Y stage 39Y and X stage 39X. The Z-leveling stage 38 drives the wafer 35 in the Z direction (vertical direction) through a Z stage driving system 38A, and simultaneously levels the wafer 35. The X stage 39X is driven relative to the wafer base 40 in the X direction by X stage driving system 43 which comprises a motor. The Y stage 39Y is driven in the Y direction by a driving motor (not shown). An L-shaped mobile mirror 41 is fixed onto the Z-leveling stage 38 for measuring the position of the Z-leveling stage 38 in the XY plane. A Laser interferometer 42 emits a laser beam externally toward the mobile mirror 41, and the mobile mirror 41 reflects the laser beam back to the laser interferometer 42. The laser interferometer 42 calculates the X and Y coordinates of the Z-leveling stage 38 based on the beam reflected from the mobile mirror 41. The X and Y coordinates of the Z-leveling stage 38, which is obtained by the laser interferometer 42, is supplied to the stage control system 33 (shown in FIG. 2). The stage control system 33 controls the motion of the X stage 39X and Y stage 39Y through the X stage driving system 43 and Y stage driving system (not shown), respectively, based on the X and Y coordinates of the Z-leveling stage 38.

A projection optical system 34 includes a lens controller 37. The lens controller 37 corrects an imagery characteristics, such as a projection magnification and distortion, by adjusting the air pressure within the space sealed between specific lenses in the projection optical system 34, or by adjusting the positions or inclination angles of the specific lenses in the projection optical system 34 with respect to the optical axis. When the illumination light IL is continuously guided to the projection optical system 34, the imagery characteristics of the projection optical system 34 changes due to accumulation of heat in the pile. To avoid this problem, the master control system 7 cancels out the change in the imagery characteristics through the lens controller 37.

The projection optical system 34 includes a focal detection system, for example, an AF sensor. When projecting the pattern of the reticle 26 onto the wafer 35, the optimum image-forming plane of the projection optical system 34, needs to be matched with photo resist surface of the wafer 35 accurately. The AF sensor used in this embodiment is an oblique incident type sensor, emitting a detection light toward the wafer 35 at a very small angle with respect to the surface of the wafer 35, and receives the reflected light to detect the Z position of the wafer 35. In FIG. 1, a light beam, which is insensitive to the resist layer coated onto the wafer 35, is emitted from a light source 50. The light beam is reflected by a mirror 52, passes through the projection optical system, and outputs an image-forming luminous flux from the projection optical system 54. The luminous flux hits the wafer 35 obliquely (at an angle of 5–20° with respect to the wafer 35). The detection light reflected by the wafer 35 is receive by a photodetector 60 through a light-receiving optical system 56 and a slit 58.

In the AF sensor of the embodiment, when the optimum image-forming plane of the projection optical system 34 is coincident with the surface of wafer 35, the photodetector 60 supplies a signal indicative of the focussing to an AF control unit 62. If the surface of the wafer 35 is out of the optimum image-forming plane of the projection optical system 34, offsetting in the Z direction, a signal corresponding to the offset amount (e.g., ± several micrometers) is supplied from the photodetector 60 to the AF control unit 62. The AF control unit 62 supplies an output signal to the master control system 7 (shown in FIG. 2) based on the signal supplied from the photodetector 60 and indicates the focussing state. The master control system 7 controls the Z-stage driving unit 38A through the stage control system 33 based on the signal from the AF control unit 62. Thus, the Z-stage stage driving system 38A drives the Z-leveling stage 38 so that the optimum image-forming plane of the projection optical system 34 coincides with the surface of the wafer 35.

An offset mechanism is provided in a part of the optical system of the AF sensor or within the AF control unit 62 for shifting the actual surface position of the wafer 35, which is represented by an AF signal output from the photodetector 60, along the optical axis of the projection optical system 34 (i.e., Z axis). The master control system 7 sets a shifting amount for the offset mechanism. When the exposure apparatus performs a multi-exposure, a plurality of shifting amounts are successively set in the offset mechanism to move the Z-axis position of the wafer surface to different positions. The shifting amounts are determined in advance, and a pattern is exposed at the respective positions. In this arrangement, even if a focal depth of the projection optical system 34 is small, the wafer is exposed with a substantially broad range of the focal depth. There are several multi-exposure methods.

Figure 3A:
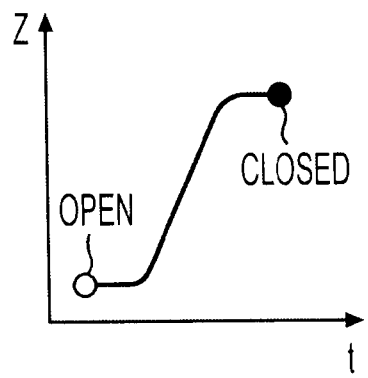
FIGS. 3A, 3B, and 3C illustrate three different types of double exposure methods used in the embodiment.
Figure 3B:
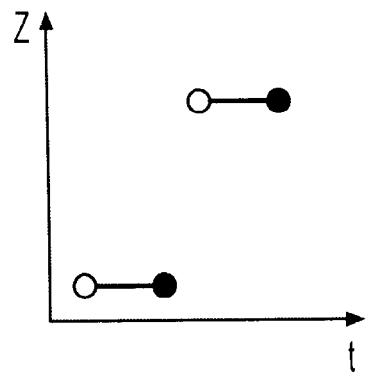
Figure 3C:
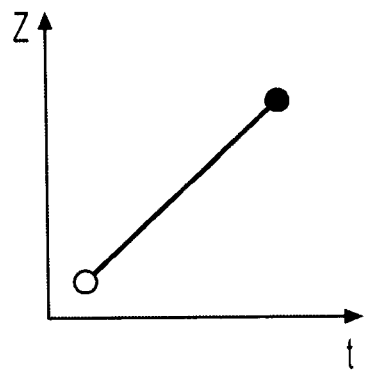

FIGS. 3A, 3B, and 3C are charts showing three types of multi-exposure methods. The horizontal axis represents a time, and the vertical axis represents a position of the wafer 35 with respect to the optical axis (Z axis). Open circles indicate the releasing operation of the shutter 21A and 21B, and dark circles indicate the closing operation of the shutter 21A and 21B. In the methods shown in FIGS. 3A and 3C, the wafer 35 is moved along the optical-axis direction (Z direction) while maintaining the shutter 21A and 21B open. On the other hand, in the method shown in FIG. 3B, the shutter 21A and 21B is open for a predetermined period of time to expose the wafer 35 while the Z position of the wafer 35 along the optical axis is fixed. After the exposure, the shutter 21A and 21B is closed. Then, the wafer 35 is moved to the next position with respect to the optical-axis direction. The shutter 21A and 21B is again released at that position to perform the next exposure.

The projection exposure apparatus used in the embodiment has an alignment system of a TTR (through-the-reticle) type, TTL (through-the-lens) type, or off-axis type. The alignment system measures the offset amount of the reticle 26 relative to the respective shot areas on the wafer 35. For performing exposure, the positional relationship between the reticle 26 and the wafer 35 is adjusted so that the positional difference between the reticle 26 and each shot area of the wafer 35 is within a predetermined acceptable range. Also, during the scanning operation, the positional relationship is adjusted as necessary so that the positional shift of the alignment mark does not exceed the acceptable range.

Figure 4:
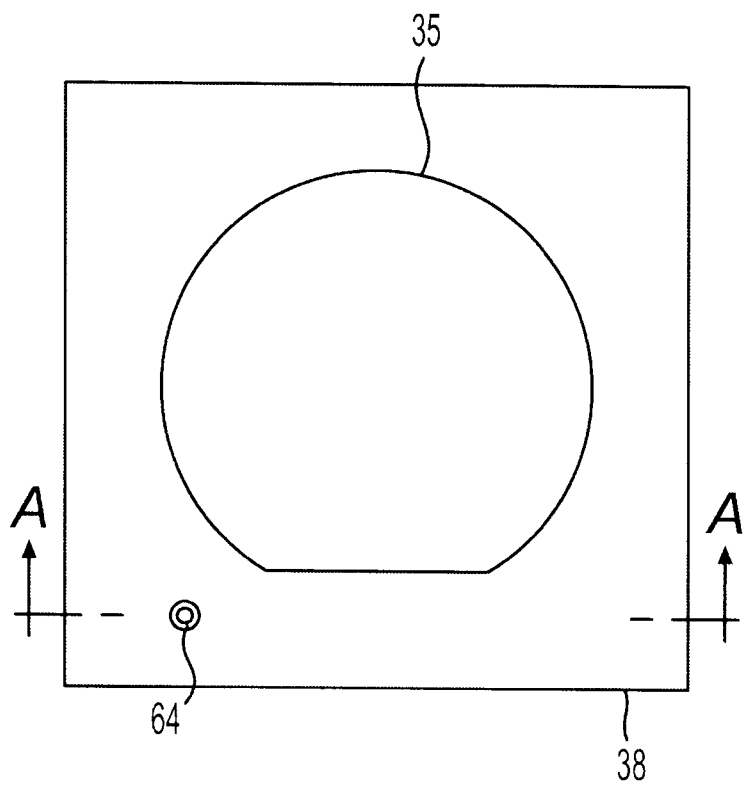
FIG. 4 is a plan view showing the major elements (in the vicinity of the wafer stage) of the embodiment.
Figure 5:
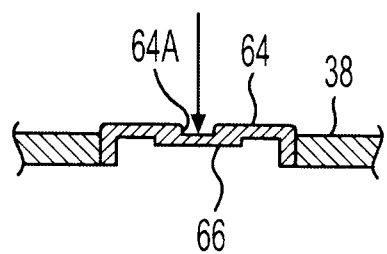
FIG. 5 is an enlarged cross-sectional view taken along the A—A line of FIG. 4.

FIG. 4 illustrates the top surface of the Z-leveling stage 38. As shown in FIGS. 1 and 4, an illuminometer 64 for measuring the illuminance of exposure light is embedded in the top surface of the Z-leveling stage 38. The top surface of the illuminometer 64 aligns with the top surface of the wafer 35 within the XY plane. FIG. 5 shows the cross-sectional structure of the illuminometer 64. The illuminometer 64 has a pin hole 64A having a diameter of about 0.5 mm. The illumination light passes through the pin hole 64A, and is received by a photoelectric converter 66. The photoelectric converter 66 converts the illuminance into an electric signal corresponding to the intensity of the illumination light. The electric signal is supplied to the master control system 7 (shown in FIG. 2).

Figure 6:
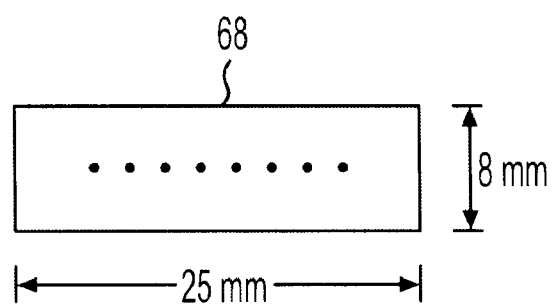
FIG. 6 illustrate a slit-like illumination area, which is used for explaining a part of the function of the embodiment.
Figure 7:
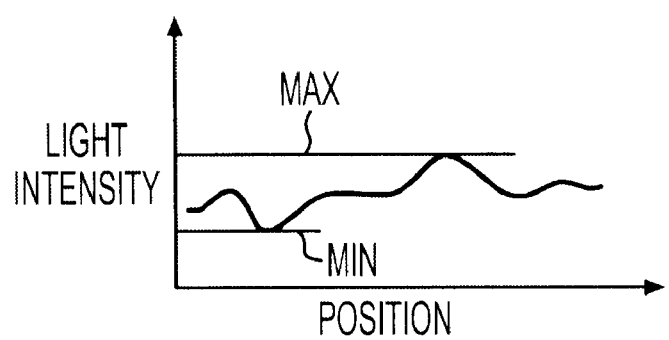
FIG. 7 is a graph indicating the function of the embodiment corresponding to FIG. 6.

In the present invention, the illuminance is measured at a plurality of points within a slit-like illumination area (exposure area) on the wafer 35 to obtain the illuminance distribution. The slit-like illumination area 68 has dimensions of, for example, 25 mm width and 8 mm height, as shown in FIG. 6. The X stage 39X and the Y stage 39Y are moved relative to the illumination area 68 to measure the illuminance at the points arranged in a matrix at an interval of 0.5 mm based on the photoelectric signal-supplied from the photoelectric converter 66. The positions of the X stage 39X and Y stage 39Y are monitored by the interferometer 42. Then, the distribution of the integral illuminance along the direction of the width of the illumination area 68 is obtained, as shown in FIG. 7. The integral illuminance is obtained by integrating the illuminance of the plurality of points along the direction of the height of the illumination area 68. The degree M of the unevenness in the integral illuminance is calculated based on the maximum integral illuminance MAX and the minimum integral illuminance MIN according to the formula (1).

$$\{(MAX-MIN)/(MAX+MIN)\} \times 100 = M(\%) \tag{1}$$

If the degree M of the unevenness exceeds an acceptable range (a predetermined threshold value), then the master control system 7 regulates the illumination system through the exposure control system 6. If the degree M of the unevenness is within the acceptable range, the test exposure is started without regulating the illumination system. A pin hole 64A is provided to limit the light-receiving area of the photoelectric converter 66 to a very small area. The size of the pin hole 64A relative to the illumination area 68 defines the measurement resolution of light intensity distribution, and is set to a desired value as desired. High resolution measurement may be achieved by shielding the light-receiving surface of the photoelectric converter 66 excluding a very small area, instead of using a pin hole 64A.

A measurement method to obtain the optimum exposure condition through test exposure will now be explained with reference to FIGS. 8 and 9. In the embodiment, the optimum exposure condition is measured in two modes, such as a collective exposure mode and a scanning exposure mode. In the collective exposure mode, the wafer 35 is moved in the step-and-repeat manner, while holding the reticle 26, and a step exposure is applied to the slit-like exposure area 68 formed by the fixed blind 19 to expose the entire exposure area on the wafer 35.

Figure 8:
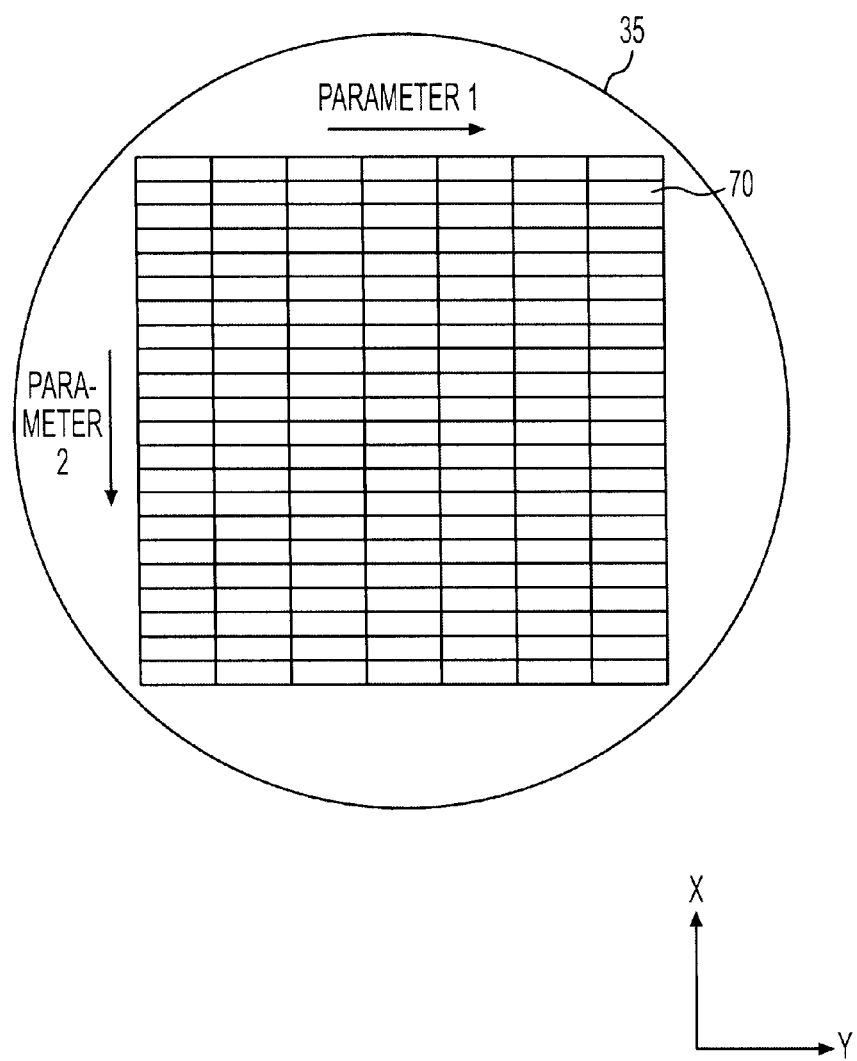
FIG. 8 illustrates the exposure area on the wafer, which is used for explaining the function of the embodiment.
Figure 9:
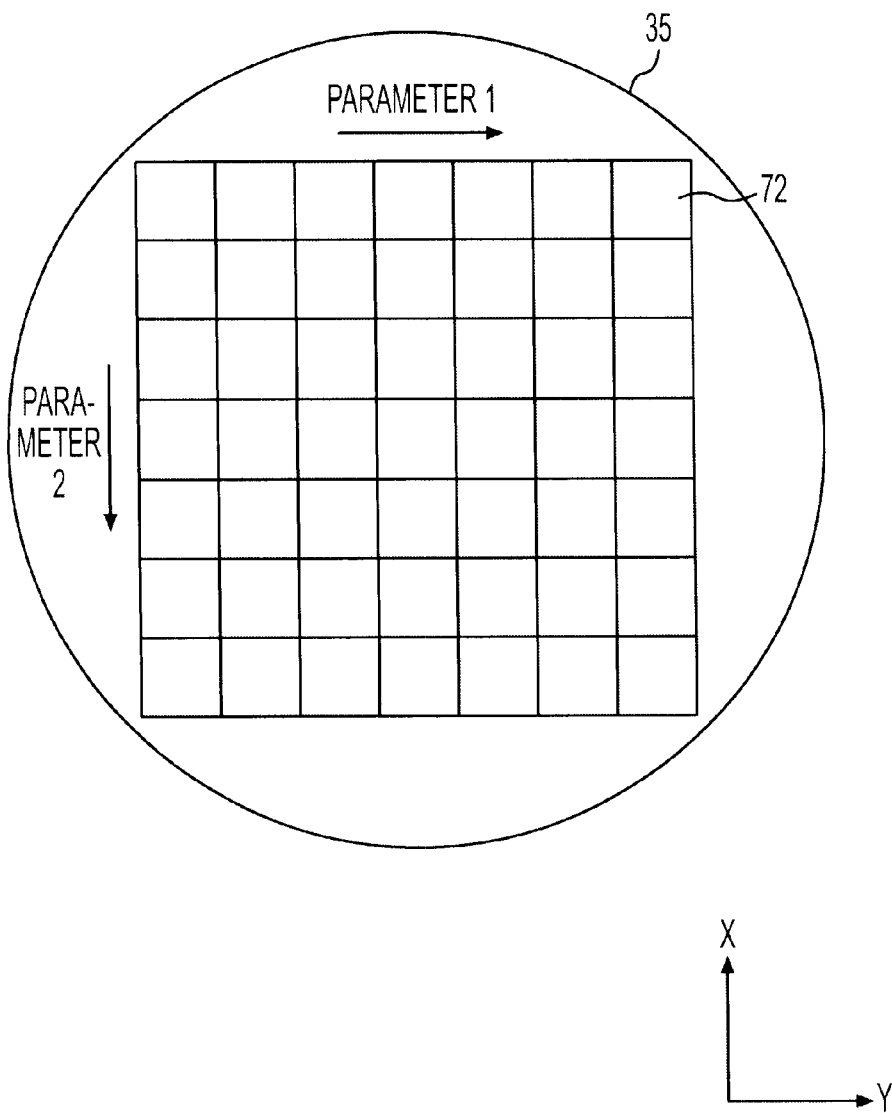
FIG. 9 illustrates the exposure area on the wafer, which is used for explaining the function of the embodiment.

FIG. 8 shows the exposure area formed on the entire area of the wafer 35. The exposure area consists of a plurality of rectangular sub-areas 70. For example, an exposure amount is taken as an exposure condition parameter 1 in the Y direction, and a focal offset is taken as the exposure condition parameter 2 in the X direction. The master control system 7 controls the power source 12 (shown in FIG. 1) through the exposure amount control system 6 so as to change the number of laser pulses emitted from the laser source 1 for each exposure sub-area 70 along the Y direction. The master control system 7 also controls the Z-stage driving system 38A through the stage control system 33 so as to change the position of the Z-leveling stage 38 in the step-motion for each sub-area 70 along the X direction. A focal position measuring mode (shown in FIG. 3), focussing amplitude (difference between the highest position and the lowest position), illumination condition may be used as the exposure condition parameter including the exposure amount and focal offset in any combination.

In the scanning exposure mode, the reticle 26 and the wafer 35 are synchronously moved relative to illumination light IL in the step-and-scanning motion, similarly to the ordinary pattern exposure. In this process, the exposure condition is changed in every exposure area (shot area) 72 on the wafer 35, as shown in FIG. 9. For example, an exposure amount is taken as a parameter 1 in the Y direction, and focal offset is taken as a parameter 2 in the X direction. In this mode, a test exposure is first performed as in the collective exposure mode (FIG. 8) to observe the exposure condition at every sub-area 70. Among the exposure sub-areas 70, the sub-areas having preferable exposure results are selected, and the parameter values of the exposure condition in the sub-areas are chosen. Then, the exposure condition is screened further by narrowing the chosen parameter values of the exposure condition, and the test exposure is again performed in the scanning exposure mode (FIG. 9) at this time. Through the two-step test exposure, the optimum exposure condition is determined very precisely. The actual exposure of the transfer pattern of the reticle 26 is performed using the step-and-scan exposure method. By performing the test exposure using the step-and-scan method prior to the actual exposure, the exposure conditions are obtained without errors.

Figure 10:
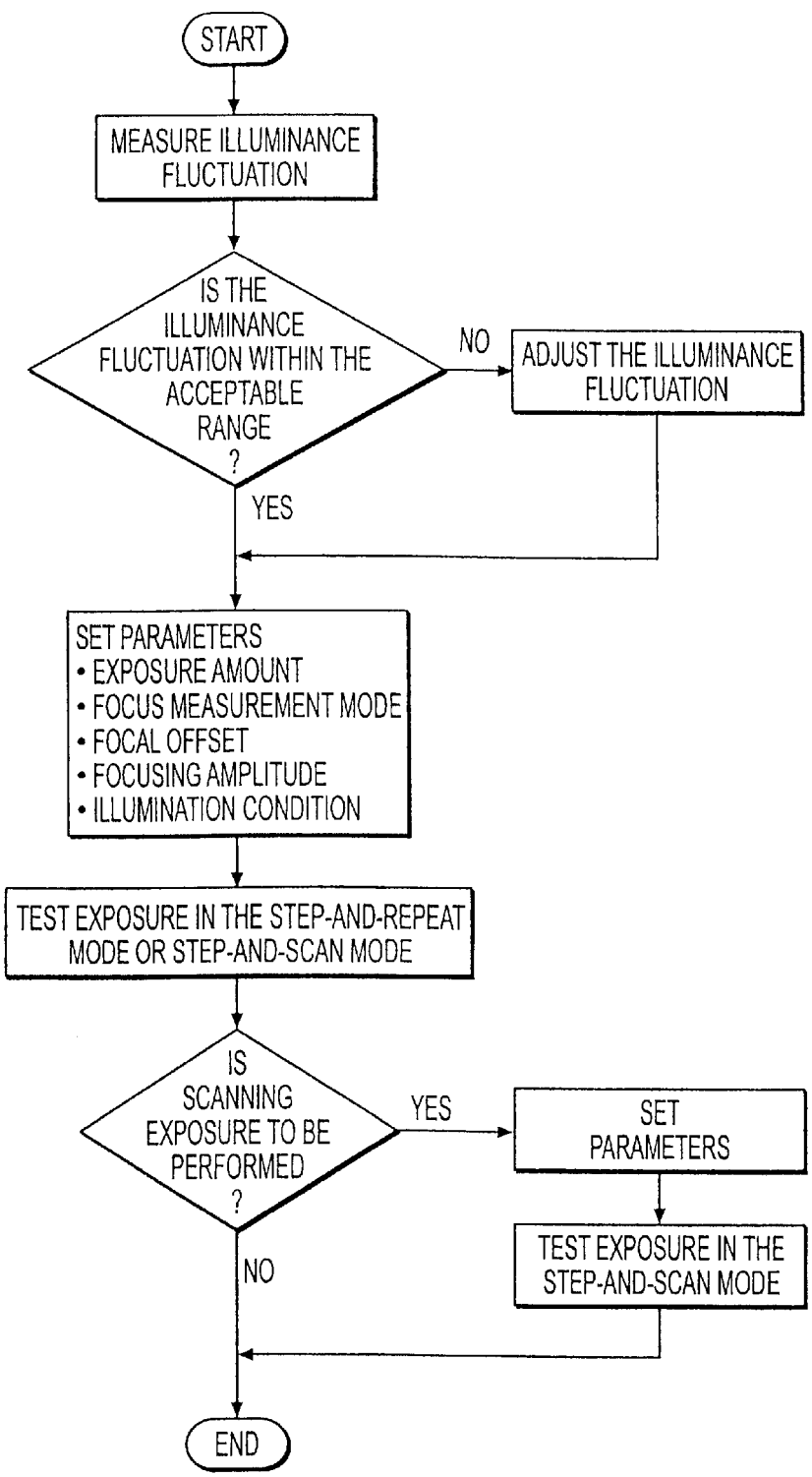
FIG. 10 is a flowchart showing the operation of the embodiment.

FIG. 10 is a flowchart showing the steps of measuring the optimum exposure condition (i.e., test exposure) according to the present invention. First of all, the wafer 35 is mounted on the Z-leveling stage 38, and a unevenness in the illuminance of illumination light IL is detected prior to the test exposure. The illuminance is measured at a plurality of points within the slit-like illumination area 68 using the illuminometer 64 disposed at the stage 38. For example, the X stage 39X and the Y stage 39Y are driven relative to the slit-like illumination area 68 having dimensions of 25 mm width and 8 mm height, as shown in FIG. 6, to measure the illuminance at the points arranged in the matrix at an interval of 0.5 mm. The master control system 7 obtains the integral illuminance of each point along the direction of the width of the illumination area 68, as shown in FIG. 7.

The degree M of the unevenness of the illuminance is calculated based on the maximum integral illuminance MAX and the minimum integral illuminance MIN according to the formula (1). If the degree M of the unevenness of the illuminance exceeds the predetermined acceptable range, the master control system 7 regulates the illumination system through the exposure amount control system 6. If the degree M of the unevenness of the illuminance is within the acceptable range, the test exposure is performed without regulating the illumination system.

A test reticle is loaded on the reticle stage 28 shown in FIG. 1. A reticle for actual exposure may be used instead of the test reticle. Parameters of the exposure condition used in the test exposure are set into the system. For example, an exposure amount, multi-exposure method (shown in FIG. 3), focal offset, focussing amplitude, and illumination condition are inputted through the keyboard 11 to the master control system 7.

Then, either the scanning exposure mode (step-and-scan mode) or the collective exposure mode (step-and-repeat mode) is selected as the test exposure mode. If the collective exposure mode is selected, the master control system 7 controls the reticle stage driving system 30 and the X stage driving system 43 through the stage control system 33 so as to move the wafer stages (39X, 39Y) in the stepwise manner, while holding the position of the reticle stage 28, to successively expose the patterns of the test reticle in the slit-like sub-areas 70, as shown in FIG. 8. At this time, the exposure condition is changed at each sub-area 70 according to the preset exposure condition parameter.

For example, in a row of seven exposure sub-areas 70 positioned along the Y direction, the exposure amount is changed at a constant rate. More specifically, the master control system 7 controls the opening/closing mechanisms 22A and 22B through the exposure amount control system 6 and the blind control unit 20 to change the release time of the movable blades 21A and 21B, for example, at a changing rate of 10 msec. On the other hand, in a column of twenty two exposure sub-areas 70 positioned along the X direction, the focal condition is changed at a constant rate. The master control system 7 instructs the offset unit of the AF control unit 62 to change the focussing amount at a changing rate of, for example, 0.25 µm according to the shot position along the X direction. Thus, the exposure conditions slightly change in each exposure sub-area 70 shown in FIG. 8. The exposure conditions set in the respective sub-areas 70 are stored in the master control system 7. In the shot arrangement shown in FIG. 8, it is not necessary to set a single parameter of the exposure condition for the row and column of sub-areas 70 in the X and Y directions. Several parameters may be combined as the exposure conditions. For example, the exposure amount and multi-exposure type may be set (and changed gradually) as the exposure conditions for the row of exposure sub-areas 70 along the Y direction, and only a focal offset may be set as the exposure condition for a column of exposure sub-areas along the X direction.

When the test exposure is finished in the collective exposure mode (step-and-repeat mode), then the wafer 35 is developed, and the exposure state is observed through naked eyes or a microscope. Those sub-areas having substantially satisfactory exposure results are selected among the overall sub-areas 70. The parameter values of the exposure condition in the selected sub-areas 70 are taken out as the first optimum exposure condition. If still more accurate exposure condition is desired, then the parameter values of the first optimum condition are selected further to set new exposure parameters. Test exposure is again performed, but in the scanning exposure mode (step-and-scan mode) using the narrowed parameter. The master control system 7 controls the reticle stage driving system 30 and the X stage driving system through the stage control system 33 so that the reticle stage 28 and the X stage 39X are synchronously moved relative to the exposure light IL. At this time, shot areas 72 shown in FIG. 9, which are larger than the illumination areas 70, are used for exposure. When the test exposure is finished in the scanning exposure mode, the wafer 35 is developed, and the exposure result is observed by naked eyes or a microscope. Among the shot areas 72, the optimum shot area is selected. The exposure condition used for the selected optimum shot area 70 is regarded as a final optimum exposure condition.

The test reticle is unloaded, and a reticle used for actual exposure is loaded. The master control system 7 sets the number of pulses emitted by the laser source 1 and the offset for the AF control unit 62, based on the optimum exposure condition obtained above, and then, actual exposure is performed.

In the present invention, a plurality of exposure subsections 70 are successively exposed with the reticle 26 being at rest, while changing the parameter value of the exposure condition, during test exposure. This method can be used for larger number of exposure areas (sub-areas 70) comparing with step-and-scan type exposure. The number of parameters for determining the exposure condition can be increased, and test exposure can be performed under various exposure conditions. The optimum exposure condition can be measured with the high resolution measurement. Among the exposure sub-areas 70, the sub-areas having substantially satisfactory exposure results are selected. Then, a plurality of shot areas 72 on the wafer 35 are exposed in the step-and-scan mode, which is the same mode as actual exposure, while changing the parameter value of the exposure condition in the vicinity of the levels obtained in the selected sub-areas 70. Thus, exposure data can be obtained under the same condition as actual exposure, and the optimum exposure condition is determined more precisely.

It will be apparent to those skilled in the art that various modification and variations can be made in the method for fabricating a semiconductor memory device of the present invention without departing from the spirit or scope of the invention. Thus, it is intended that the present invention cover the modifications and variations of this invention provided they come within the scope of the appended claims and their equivalents.

What is claimed is:

1. A method for manufacturing an exposure apparatus which transfers a prescribed pattern on a first mask onto a prescribed area on a substrate by illuminating the prescribed pattern on the first mask using an ArF excimer laser or pulsed laser generated by a harmonic generator, the method comprising the steps of:

providing a projection apparatus, which is arranged in the exposure apparatus, and that test exposes a predetermined pattern on a second mask onto an object to be illuminated using the ArF excimer laser or pulsed laser generated by the harmonic generator, providing a device electrically connected to the projection apparatus to cause the projection apparatus to test expose the predetermined pattern on the second mask onto a predetermined area on the object to be illuminated, the predetermined area on the object to be illuminated having a size different from that of the prescribed area;

providing a device, which is electrically connected to the exposure apparatus, and that adjusts the exposure apparatus in accordance with a predetermined condition obtained through evaluating an image of the predetermined pattern test exposed onto the predetermined area on the object to be illuminated;

providing a device that detects illuminance of an illumination area on the object to be illuminated before test exposing the predetermined pattern onto the predetermined area; and providing a device, which is electrically connected to the projection apparatus and the device that detects illuminance, and that calculates the degree of the unevenness of the illuminance based on a detection result of the device that detects illuminance, and allows execution of a test exposure operation by the projection apparatus for test exposing the predetermined pattern on the second mask onto the object to be illuminated when the degree of the unevenness of the illuminance is within an acceptable range.

2. A method for manufacturing an exposure apparatus which transfers a prescribed pattern on a first mask onto a prescribed area on a substrate by illuminating the prescribed pattern on the first mask using an ArF excimer laser or pulsed laser generated by a harmonic generator and using a first projection operation, the method comprising the steps of:

providing a projection apparatus arranged in the exposure apparatus and that test exposes a predetermined pattern on a second mask onto an object to be illuminated using the ArF excimer laser or pulsed laser generated by the harmonic generator;

providing a device electrically connected to the projection apparatus to cause the projection apparatus to test expose the predetermined pattern on the second mask onto a predetermined area on the object to be illuminated using a second projection operation different from the first projection operation;

providing an adjustment device electrically connected to the exposure apparatus and that adjusts the exposure apparatus in accordance with a predetermined condition obtained through evaluating an image of the predetermined pattern test exposed onto the predetermined area on the object to be illuminated;

providing a device that detects illuminance of an illumination area on the object to be illuminated before the test exposure operation using the second projection operation; and providing a device, which is electrically connected to the projection apparatus and the device that detects illuminance, and that calculates the degree of the unevenness of the illuminance based on a detection result of the device that detects illuminance, and allows execution of the test exposure operation by the projection apparatus for projecting the predetermined pattern on the second mask onto the object to be illuminated when the degree of the unevenness of the illuminance is within an acceptable range.

3. A scanning exposure apparatus that exposes a plurality of shot areas on a substrate held on a substrate stage with a circuit pattern formed on a first mask by performing a scanning exposure operation in which the first mask and the substrate are relatively moved in synchronization while the circuit pattern is illuminated with an illumination beam, the apparatus comprising:

an illumination system which radiates said illumination beam onto a mask;

an illuminometer which is provided on said substrate stage and which detects illuminance of said illumination beam that has reached the substrate stage; and a controller which is electrically connected to said illuminometer and which controls a detecting operation of the illuminometer and a test exposure operation that exposes predetermined areas on an object to be illuminated with a pattern formed on said first mask or on a second mask different from the first mask under a plurality of exposure conditions, the controller controlling the illuminometer to perform its detecting operation before the test exposure operation, wherein the controller calculates the degree of the unevenness of the illuminance based on a detection result of the illuminometer, and allows execution of the test exposure operation when the degree of the unevenness of the illuminance is within an acceptable range.

4. The apparatus according to claim 3, wherein said controller regulates said illumination system when said degree of the unevenness of the illuminance exceeds said acceptable range.

5. The apparatus according to claim 3, wherein each predetermined area has a size different from that of each shot area.

6. The apparatus according to claim 5, wherein the size of each predetermined area is smaller than that of each shot area.

7. The apparatus according to claim 6, wherein said test exposure operation is performed in a condition that said mask and said object are substantially at rest during the radiation of said illumination beam by said illumination system.

8. The apparatus according to claim 3, wherein said test exposure operation is performed using an exposure operation different from said scanning exposure operation.

9. The apparatus according to claim 8, wherein said test exposure operation is performed in a condition that said mask and said object are substantially at rest during the radiation of said illumination beam by said illumination system.

10. The apparatus according to claim 3, wherein said exposure condition includes a focusing condition of a pattern image formed on said object to be illuminated.

11. The apparatus according to claim 3, wherein said exposure condition includes at least one of an exposure amount, focus offset, focus width, illumination condition, and multiple exposure conditions.

12. The apparatus according to claim 3, wherein said test exposure operation uses at least one of said scanning exposure operation and a static exposure operation, the static exposure operation exposing the object to be illuminated in a condition that said mask and said object are substantially at rest during the radiation of said illumination beam by said illumination system.

13. The apparatus according to claim 12, wherein said test exposure operation includes both of said scanning exposure operation and said static exposure operation.

14. The apparatus according to claim 3, wherein said object to be illuminated includes said substrate having said plurality of predetermined areas, and in said test exposure operation, said plurality of predetermined areas are sequentially exposed while changing the exposure condition.

15. The apparatus according to claim 14, further comprising:
an adjusting device which adjusts the exposure apparatus in accordance with an optimum exposure condition obtained based on a plurality pattern images formed on the substrate by the test exposure operation.

16. The apparatus according to claim 3, wherein said illumination beam includes an excimer laser beam or pulsed laser generated by a harmonic generator.

17. The apparatus according to claim 16, wherein said excimer laser beam includes an ArF excimer laser beam.

18. A method for exposing a prescribed pattern on a first mask onto a prescribed area on a substrate by illuminating the prescribed pattern on the first mask using an ArF excimer laser or pulsed laser generated by a harmonic generator, the method comprising the steps of:

test exposing a predetermined pattern on a second mask onto a predetermined area on an object to be illuminated using the ArF excimer laser or pulsed laser generated by the harmonic generator, the predetermined area on the object to be illuminated having a size different from that of the prescribed area;

adjusting an exposure apparatus in accordance with a predetermined condition obtained through evaluating an image of the predetermined pattern test exposed onto the predetermined area on the object to be illuminated;

detecting illuminance of an illumination area on the object to be illuminated before test exposing the predetermined pattern onto the predetermined area; and calculating the degree of the unevenness of the illuminance based on a detection result of the illuminance, and allowing execution of a test exposure operation for test exposing the predetermined pattern on the second mask onto the object to be illuminated when the degree of the unevenness of the illuminance is within an acceptable range.

19. A method for exposing a prescribed pattern on a first mask onto a prescribed area on a substrate by illuminating the prescribed pattern on the first mask using an ArF excimer laser or pulsed laser generated by a harmonic generator and using a first projection operation, the method comprising the steps of:

test exposing a predetermined pattern on a second mask onto a predetermined area on an object to be illuminated using the ArF excimer laser or pulsed laser generated by the harmonic generator, the test exposing using a second projection operation different from the first projection operation;

adjusting an exposure apparatus in accordance with a predetermined condition obtained through evaluating an image of the predetermined pattern test exposed onto the predetermined area on the object to be illuminated;

detecting illuminance of an illumination area on the object to be illuminated before the test exposure operation using the second projection operation; and calculating the degree of unevenness of the illuminance based on a detection result of the illuminance, and allowing execution of a projection operation for projecting the predetermined pattern on the second mask onto the object to be illuminated when the degree of the unevenness of the illuminance is within an acceptable range.

20. A scanning exposure method for exposing a plurality of shot areas on a substrate held on a substrate stage with a circuit pattern formed on a first mask by performing a scanning exposure operation in which the first mask and the substrate are relatively moved in synchronization while the circuit pattern is illuminated with an illumination beam, the method comprising:

performing a test exposure operation for test exposing predetermined areas on an object to be illuminated with a pattern formed on said first mask or on a second mask different from the first mask under a plurality of exposure conditions;

performing a detecting operation for detecting illuminance of said illumination beam that has reached the substrate stage before performing the test exposure operation; and calculating the degree of unevenness of the illuminance based on a detection result of the detection operation and allowing execution of the test exposure operation when the degree of the unevenness of the illuminance is within an acceptable range.

* * * * *